United States Patent
Seeger

(10) Patent No.: US 12,286,342 B2
(45) Date of Patent: Apr. 29, 2025

(54) CONSTANT CHARGE OR CAPACITANCE FOR CAPACITIVE MICRO-ELECTRICAL-MECHANICAL SYSTEM SENSORS

(71) Applicant: INVENSENSE, INC., San Jose, CA (US)

(72) Inventor: Joseph Seeger, Menlo Park, CA (US)

(73) Assignee: INVENSENSE, INC., San Jose, CA (US)

(*) Notice: Subject to any disclaimer, the term of this patent is extended or adjusted under 35 U.S.C. 154(b) by 112 days.

(21) Appl. No.: 18/066,802

(22) Filed: Dec. 15, 2022

(65) Prior Publication Data

US 2023/0192479 A1 Jun. 22, 2023

Related U.S. Application Data

(60) Provisional application No. 63/291,604, filed on Dec. 20, 2021.

(51) Int. Cl.
*B81B 7/02* (2006.01)
*H02M 3/07* (2006.01)

(52) U.S. Cl.
CPC ............... *B81B 7/02* (2013.01); *H02M 3/07* (2013.01); *B81B 2201/0221* (2013.01);
(Continued)

(58) Field of Classification Search
CPC .............. B81B 7/02; B81B 2201/0221; B81B 2201/0257; B81B 2203/04; B81B 2207/03; H02M 3/07; H04R 3/00
See application file for complete search history.

(56) References Cited

U.S. PATENT DOCUMENTS

| | | | |
|---|---|---|---|
| 5,392,001 A * | 2/1995 | Uhling | G01R 1/30 324/123 C |
| 10,284,963 B2 | 5/2019 | Koymen et al. | |

(Continued)

FOREIGN PATENT DOCUMENTS

| | | |
|---|---|---|
| WO | 2018178772 A2 | 10/2018 |
| WO | 2019135204 A1 | 7/2019 |

OTHER PUBLICATIONS

International Search Report and Written Opinion mailed May 11, 2023 for PCT Application No. PCT/US2022/053420, 13 pages.
(Continued)

*Primary Examiner* — Akm Zakaria
(74) *Attorney, Agent, or Firm* — Amin, Turocy & Watson, LLP

(57) ABSTRACT

Embodiments for constant charge or capacitance for capacitive micro-electro-mechanical system (MEMS) sensors are presented herein. A MEMS device comprises a sense element circuit comprising a bias resistance, a charge-pump, and a capacitive sense element comprising an electrode and a sense capacitance. The charge-pump generates, at a bias resistor electrically coupled to the electrode, a bias voltage that is inversely proportional to a capacitance value comprising a value of the sense capacitance to facilitate maintenance of a nominally constant charge on the electrode. A sensing circuit comprises an alternating current (AC) signal source that generates an AC signal at a defined frequency; and generates, based on the AC signal, an AC test voltage at a test capacitance that is electrically coupled to the electrode. The sense element circuit generates, based on the AC test voltage at the defined frequency, an output signal representing the value of the sense capacitance.

24 Claims, 15 Drawing Sheets

$V_o = V_t{}^*C_t/(C_{MEMS} + C_t)$ + signal corresponding to external force

(52) U.S. Cl.
CPC ... *B81B 2201/0257* (2013.01); *B81B 2203/04* (2013.01); *B81B 2207/03* (2013.01)

(56) References Cited

U.S. PATENT DOCUMENTS

| | | | |
|---|---|---|---|
| 10,681,473 B2 | 6/2020 | Koymen et al. | |
| 10,757,510 B2 | 8/2020 | Koymen et al. | |
| 2005/0099188 A1* | 5/2005 | Baxter | G01D 5/24 |
| | | | 324/678 |
| 2007/0160234 A1* | 7/2007 | Deruginsky | H04R 3/00 |
| | | | 381/113 |
| 2011/0063154 A1* | 3/2011 | Hotelling | H03M 3/494 |
| | | | 341/143 |
| 2012/0306801 A1* | 12/2012 | Rai | G06F 3/0446 |
| | | | 345/174 |
| 2013/0279717 A1 | 10/2013 | Reimann et al. | |
| 2016/0157017 A1* | 6/2016 | Lesso | G01P 15/125 |
| | | | 381/71.7 |
| 2018/0302726 A1 | 10/2018 | Koymen et al. | |
| 2020/0007992 A1 | 1/2020 | Koymen et al. | |
| 2020/0092657 A1 | 3/2020 | Koymen et al. | |
| 2024/0171917 A1 | 5/2024 | Seeger et al. | |

OTHER PUBLICATIONS

European Office Action mailed Jul. 30, 2024 for European Patent Application No. 22854242.9, 3 pages.
International Preliminary Report on Patentability mailed Jul. 4, 2024 for PCT Application No. PCT/US2022/053420, 8 pages.
Widder, et al. "Basic principles of MEMS microphones" EDN, May 14, 2014. [https://www.edn.com/basic-principles-of-mems-microphones/], retrieved Aug. 8, 2024, 15 pages.
Hutcherson, et al. "On the squeeze-film damping of micro-resonators in the free-molecule regime" Journal of Micromechanics and Microengineering, Sep. 2004, 8 pages.
"Vapor Etch Solutions for Releasing Mems" Kla, Feb. 23, 2023, [https://www.kla.com/advance/innovation/vapor-etch-solutions-for-releasing-mems] retrieved May 23, 2024, 8 pages.
"MEMS Tutorial: Pull-in voltage in electrostatic microactuators" Ville Kaajakari, [https://www.kaajakari.net/~ville/research/tutorials/pull_in_tutorial.pdf], retreived Feb. 16, 2025, 2 pages.

* cited by examiner $V_o = V_t * C_t / (C_{MEMS} + C_t)$ + signal corresponding to external force $V_o = V_t * C_t / (C_{MEMS} + C_t)$ + signal corresponding to external force $V_o = V_t * C_t / (C_{MEMS}) +$ signal corresponding to external force $V_o = V_t * C_t / (C_{MEMS} + C_t)$ + signal corresponding to external force $V_o = V_t \cdot C_t/(C_{MEMS} + C_t)$ + signal corresponding to external force

CONSTANT CHARGE OR CAPACITANCE FOR CAPACITIVE MICRO-ELECTRICAL-MECHANICAL SYSTEM SENSORS

CROSS-REFERENCE TO RELATED APPLICATION

This patent application claims priority to U.S. Provisional Patent Application No. 63/291,604, filed on Dec. 20, 2021, and entitled "CONSTANT CHARGE FOR CAPACITIVE MEMS SENSORS"; the entirety of the aforementioned application is hereby incorporated by reference herein.

TECHNICAL FIELD

The subject disclosure generally relates to embodiments for constant charge or capacitance for capacitive micro-electro-mechanical system (MEMS) sensors.

BACKGROUND

Conventional MEMS microphone technologies apply a bias voltage to a membrane of a MEMS microphone—the bias voltage creating charge on the membrane, which converts capacitance changes due to applied sound pressure into an output voltage.

The bias voltage also creates an electrostatic force that pulls the membrane towards a backplate. When too much bias voltage is applied, a corresponding increase in electrostatic force will cause the membrane to snap, or collapse, to the backplate. The amount of bias voltage that causes the membrane to snap to the backplate is called a "collapse" or "pull-in" voltage. Typically, a bias voltage of approximately 70-80% of the pull-in voltage is applied to avoid collapse of the membrane. Appling higher bias to the membrane increases the charge on the membrane, which correspondingly leads to an increase in output voltage representing the sound pressure. Although it is desired to increase the bias voltage as much as possible to improve microphone sensitivity and improve a signal-to-noise-ratio (SNR) of the MEMS microphone, increasing the bias voltage to, and/or past, the pull-in voltage causes the MEMS microphone to be unstable and/or inoperable.

In this regard, conventional MEMS microphone technologies have had some drawbacks, some of which may be noted with reference to the various embodiments described herein below.

BRIEF DESCRIPTION OF THE DRAWINGS

Non-limiting embodiments of the subject disclosure are described with reference to the following Figures, wherein like reference numerals refer to like parts throughout the various views unless otherwise specified.

DETAILED DESCRIPTION

Figure 1:
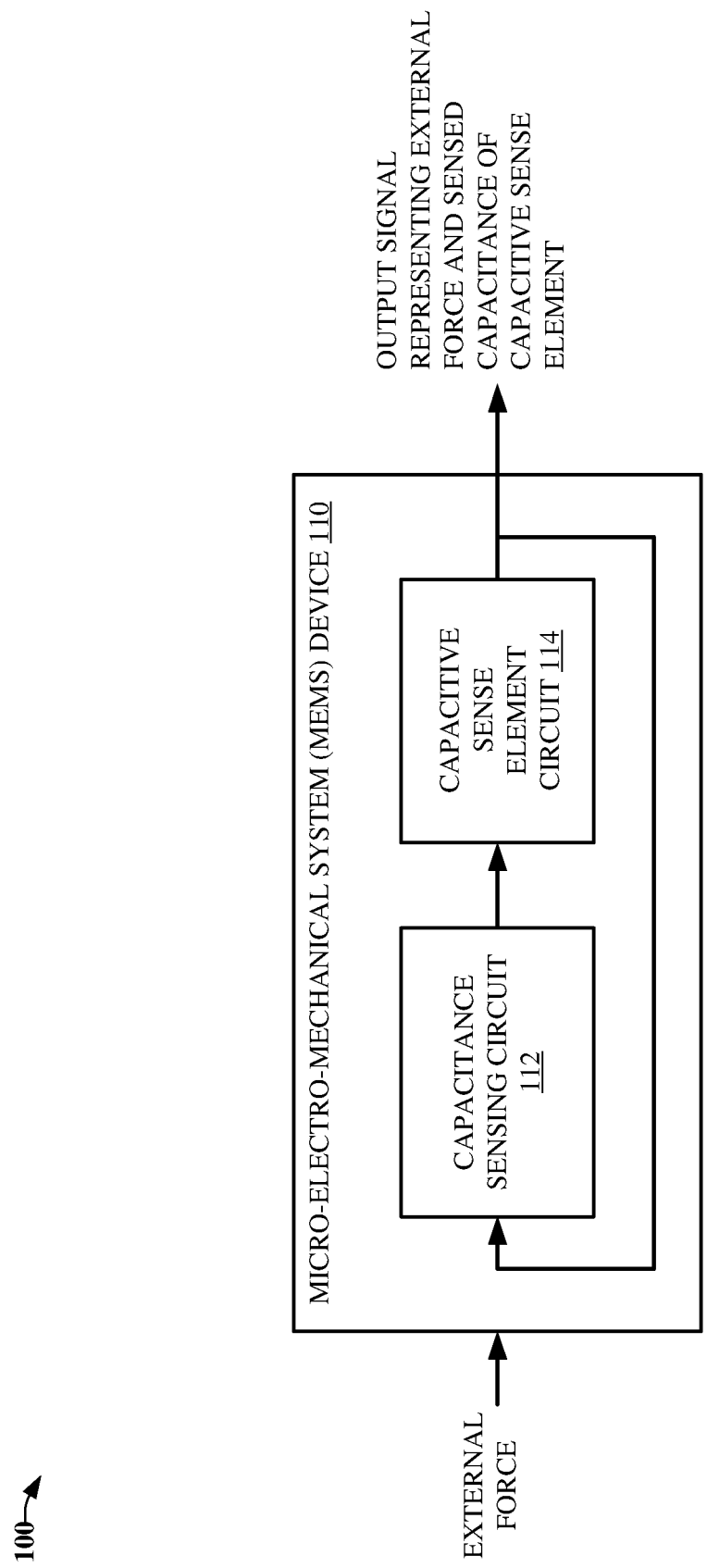
FIG. 1 illustrates a block diagram of a MEMS device that applies a nominally constant charge to a capacitive sense element of the MEMS device, or facilitates maintenance of a nominally constant capacitance value of a sense capacitance of the capacitive sense element, in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

Conventional microphone technologies have had some drawbacks with respect to being unstable and/or inoperable when a bias voltage that has been applied to a membrane of a MEMS microphone is at, or exceeds, a pull-in voltage of the MEMS microphone. Various embodiments disclosed herein can enable biasing a membrane of a MEMS device closer to, or beyond, the pull-in voltage by applying a nominally constant charge to a capacitive sense element of the MEMS device, or by maintaining a nominally constant capacitance value of a sense capacitance of the capacitive sense element.

For example, in embodiment(s), a MEMS device (110), e.g., microphone, accelerometer, pressure sensor, ultrasonic receiver, gyroscope, or other type of vibration sensing device, comprises a capacitive sense element circuit (114) comprising a bias resistance (220) comprising a resistance input and a resistance output, a charge-pump (210) comprising a charge pump input and a charge pump output, and a capacitive sense element (230) comprising an electrode (222) and a sense capacitance, in which the charge-pump output generates a bias voltage at the resistance input, the resistance output is electrically coupled to the electrode of the capacitive sense element, and the bias voltage is proportional to an inverse of a capacitance value comprising the value of the sense capacitance to facilitate maintenance of a nominally constant charge on the electrode of the capacitive sense element.

The MEMS device further comprises a capacitance sensing circuit (112) comprising: a gain circuit (270); a demodulator (260) that modulates a first demodulator input and a second demodulator input to obtain a demodulator output that is electrically coupled, via the gain circuit, to the charge pump input; an alternating current (AC) signal source (240) that generates an AC signal (e.g., an analog voltage; a digital waveform) at a defined frequency, in which the AC signal is electrically coupled to the first demodulator input; and a test capacitance (250) comprising a test capacitance input and a test capacitance output.

The capacitance sensing circuit generates, based on the AC signal at the defined frequency, an AC test voltage at the test capacitance input. The test capacitance output is electrically coupled to the electrode of the capacitive sense element. The capacitive sense element circuit generates, based on the AC test voltage at the defined frequency, an output signal that is electrically coupled to the second demodulator input and that represents a value of the sense capacitance.

In embodiment(s), the defined frequency is greater than a resonant frequency of the capacitive sense element. In other embodiment(s), the defined frequency is in a range of about 50 kHz to about 1 MHz.

In yet other embodiments(s), a first portion of the output signal of the capacitive sense element circuit represents an external force that has been applied to a membrane of the capacitive sense element, and a second portion of the output signal of the capacitive sense element circuit represents a measurement of the value of the sense capacitance.

In embodiment(s), an amplifier (410) is electrically coupled between the AC signal source and the test capacitance, and generates, based on the AC signal, the AC test voltage at the test capacitance input.

In yet other embodiment(s), the amplifier comprises a summing amplifier (610) comprising a first amplifier input, a second amplifier input, and an amplifier output, in which the first amplifier input is electrically coupled to the AC signal, the second amplifier input is electrically coupled to the output signal of the capacitive sense element circuit, and the amplifier output is electrically coupled to the test capacitance input—the summing amplifier generating, via the amplifier output based on the AC signal, the AC test voltage at the test capacitance input.

In embodiment(s), an amplitude of the second portion of the output signal of the capacitive sense element circuit is inversely proportional to the value of the sense capacitance.

In embodiment(s), the capacitive sense element circuit further comprises an inverting buffer (820) that generates an inverted output signal that is based on the output signal of the capacitance sense element circuit, in which a differential output signal of the capacitive sense element circuit is represented by the output signal and the inverted output signal. The capacitance sensing circuit further comprises a difference circuit (810) that comprises a first difference circuit input, a second difference circuit input, and a difference circuit output. The first difference circuit input is electrically coupled to the output signal of the capacitive sense element circuit, the second difference circuit input is electrically coupled to the inverted output signal, and the difference circuit output is electrically coupled to the second demodulator input of the demodulator.

In other embodiment(s), the gain circuit comprises a low-pass filter (272) electrically coupled to a gain stage (274) comprising a defined gain, in which the nominally constant charge is proportional to the defined gain; and.

In yet other embodiment(s), the MEMS device further comprises a bootstrap capacitance (336) that is electrically coupled between the electrode of the capacitive sense element and the output signal of the capacitive sense element circuit. In embodiment(s), the bootstrap capacitance facilitates reducing noise of the output signal of the capacitive sense element circuit in response to the capacitive sense element being biased in a negative capacitance region.

In other embodiment(s), a MEMS device (110), e.g., microphone, accelerometer, pressure sensor, ultrasonic receiver, gyroscope, or other type of vibration sensing device, comprises: a capacitive sense element circuit (114) comprising a bias resistance (220) comprising a resistance input and a resistance output, a charge-pump (210) comprising a charge pump input and a charge pump output, and a capacitive sense element (230) comprising an electrode (222) and a sense capacitance, in which the charge-pump output generates a bias voltage at the resistance input, and the resistance output is electrically coupled to the electrode of the capacitive sense element.

The MEMS device further comprises a capacitance sensing circuit (112) comprising: a gain circuit (970) that comprises a difference circuit (910) and a filter (920); a demodulator (260) that modulates a first demodulator input and a second demodulator input to obtain a demodulator output that is electrically coupled, via the gain circuit, to the charge pump input; an AC signal source (240) that generates an AC signal (e.g., an analog voltage; a digital waveform) at a defined frequency, in which the AC signal is electrically coupled to the first demodulator input; and a test capacitance (250) comprising a test capacitance input and a test capacitance output.

The capacitance sensing circuit generates, based on the AC signal at the defined frequency, an AC test voltage at the test capacitance input. The test capacitance output is electrically coupled to the electrode of the capacitive sense element. The capacitive sense element circuit generates, based on the AC test voltage at the defined frequency, an output signal that is electrically coupled to the second demodulator input and that represents a value of the sense capacitance.

The demodulator output is electrically coupled to a first input of the difference circuit, a reference signal is electrically coupled to a second input of the difference circuit, a difference output of the difference circuit is electrically coupled, via the filter, to the charge-pump input, and the demodulator output nominally equals the reference signal to facilitate maintenance of a nominally constant value of the sense capacitance.

In yet other embodiment(s), the defined frequency is greater than a resonant frequency of the capacitive sense element. In embodiment(s), the defined frequency is in a range of about 50 kHz to about 1 MHz.

In other embodiment(s), a first portion of the output signal of the capacitive sense element circuit represents an external force that has been applied to a membrane of the capacitive sense element, and a second portion of the output signal of the capacitive sense element circuit represents a measurement of the value of the sense capacitance.

In embodiment(s), a first magnitude of a sum of respective DC component values of the sense capacitance and the test capacitance is inversely proportional to a second magnitude of a second DC component of the reference signal.

In other embodiment(s), an amplifier (410) is electrically coupled between the AC signal source and the test capacitance, and generates, based on the AC signal, the AC test voltage at the test capacitance input.

In yet other embodiment(s), the amplifier comprises a summing amplifier (610) comprising a first amplifier input, a second amplifier input, and an amplifier output, in which the first amplifier input is electrically coupled to the AC signal, the second amplifier input is electrically coupled to the output signal of the capacitive sense element circuit, and the amplifier output is electrically coupled to the test capacitance input—the summing amplifier generating, via the amplifier output based on the AC signal, the AC test voltage at the test capacitance input.

In other embodiment(s), an amplitude of the second portion of the output signal of the capacitive sense element circuit is inversely proportional to the value of the sense capacitance.

In embodiment(s), the MEMS device further comprises a bootstrap capacitance (336) that is electrically coupled between the electrode of the capacitive sense element and the output signal of the capacitive sense element circuit. In other embodiment(s), the bootstrap capacitance facilitates reducing noise of the output signal of the capacitive sense element circuit in response to the capacitive sense element being biased in a negative capacitance region.

In yet other embodiment(s), a method comprises detecting a value of a sense capacitance of a capacitive sense element of a MEMS device; generating a continuous time bias voltage that is inversely proportional to a capacitance value comprising the value of the sense capacitance; and in response to applying the continuous time bias voltage to the capacitive sense element, generating a nominally constant charge on the capacitive sense element.

In embodiment(s), the detecting of the value of the sense capacitance comprises applying an AC test voltage at a defined frequency to a test capacitance input of a test capacitance, in which a test capacitance output of the test capacitance is electrically coupled to the capacitive sense element, and an output signal of the MEMS device represents, based on the AC test voltage at the defined frequency, the value of the sense capacitance.

In other embodiment(s), the applying of the AC test voltage to the test capacitance input further comprises applying the AC test voltage to the test capacitance input in a frequency range of about 50 kHz to about 1 MHz.

In yet other embodiment(s), the method further comprises in response to biasing the capacitance of the capacitive sense element in a negative capacitance region, reducing, via a bootstrap capacitance that is electrically coupled to an output signal of the MEMS device, a noise of the output signal of the MEMS device.

Ideally, a capacitance ($C_{MEMS}$) of the capacitive sense element depends on an electrode area (A) of an electrode of the capacitive sense element and a gap (g) between the electrode and a backplate of the capacitive sense element:

$$C_{MEMS} = \frac{\epsilon A}{g}.$$

The gap depends on initial gap (go), external force (F, i.e., sound pressure), charge (q), and membrane stiffness (k):

$$g = g_0 - \frac{F}{k} - \frac{1}{2}\frac{q^2}{\epsilon A k}.$$

The gap decreases with charge; and the capacitance increases with charge.

The voltage across the capacitive sense element depends on the charge and the capacitance of the capacitive sense element:

$$V = q\frac{q}{\epsilon A} = \frac{q}{\epsilon A}\left(g_0 - \frac{F}{k} - \frac{1}{2}\frac{q^2}{\epsilon A k}\right).$$

The voltage across the capacitive sense element changes due to charge, q, and due to changes in an external force (F), e.g., sound pressure, which has been applied to the capacitive sense element.

To increase a sensitivity of the capacitive sense element—represented by a change in the voltage across the capacitive sense element due to a change in force, e.g., sound pressure, which has been applied to the capacitive sense element—it is desirable to increase the charge (q) that is applied to the electrode.

Figure 12:
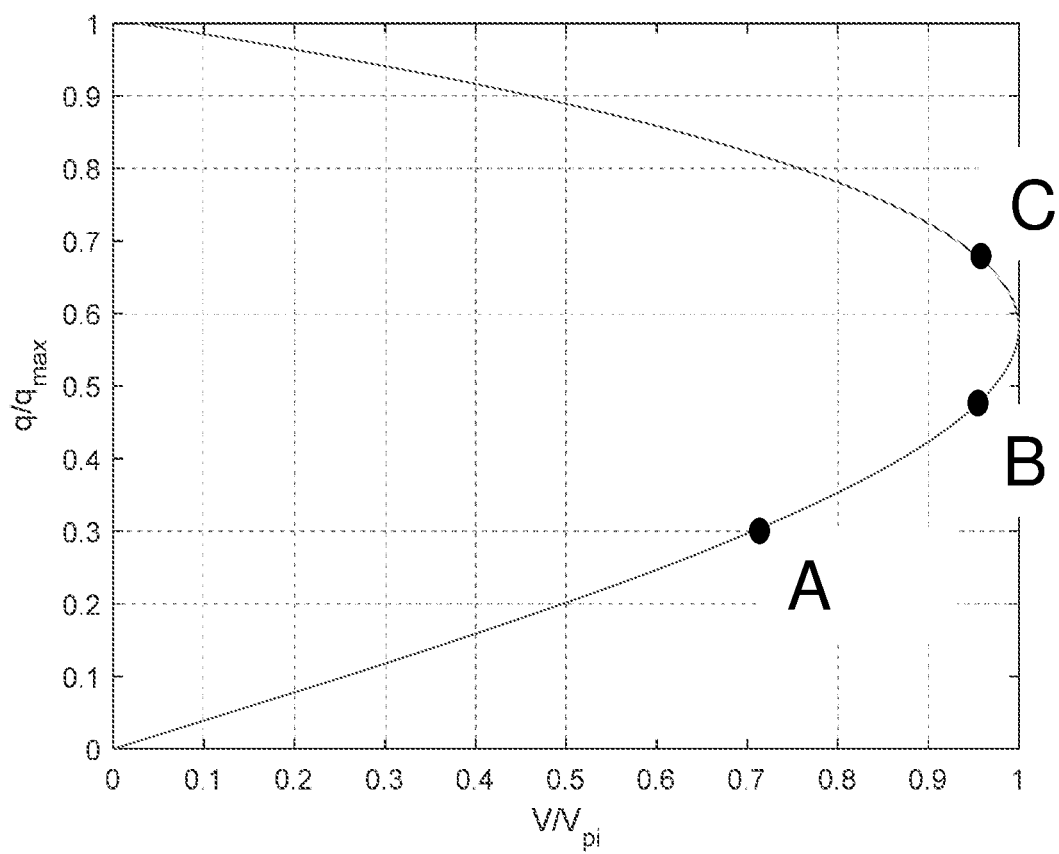
FIG. 12 illustrates a plot of normalized charge versus normalized bias voltage of a MEMS device, in accordance with various example embodiments.

Referring now to FIG. 12, a plot (1200) of normalized charge versus normalized bias voltage (at zero force) of a conventional MEMS device, e.g., microphone, is illustrated, in accordance with various example embodiments. The maximum bias voltage that can be applied, via conventional technologies, to the conventional MEMS device is a pull-in voltage of "Vpi", e.g., represented by a ratio of 1 on the plot.

Point "A" represents a typical bias point of a conventional MEMS device, which is approximately 70% of the pull-in voltage.

Point "B" represents a higher bias voltage and charge, which has been applied to the conventional MEMS device, than bias voltage and charge that has been applied to the conventional MEMS device at point A; therefore, point B represents a higher capacitance and higher sensitivity of the conventional MEMS device than capacitance and sensitivity of the conventional MEMS device corresponding to point A.

Under ideal conditions, the conventional MEMS device is stable with an applied bias voltage corresponding to point B; however, because such bias voltage is near the pull-in voltage, the conventional MEMS device is likely to be unstable in practice due to parameter variation(s) of the conventional MEMS device that occur over process and temperature changes.

Point "C" represents a bias point corresponding to a charge, a sensitivity, and a capacitance that are higher than respective charges, sensitivities, and capacitances represented by bias points A and B; however, point C it is beyond the pull-in voltage, and therefore the conventional MEMS device is unstable with a constant bias voltage being applied at point C.

As conventional capacitive-based sensor technologies utilize a constant voltage source to bias a capacitive sense element, FIG. 12 illustrates that such technologies are limited in an amount of charge that can be applied to the capacitive sense element, and thus in an amount of sensitivity that can be achieved—due to instability corresponding to the pull-in voltage.

On the other hand, various embodiments disclosed herein can enable improved biasing of a membrane of a MEMS device, e.g., beyond a pull-in voltage of the MEMS device, by facilitating maintenance of a nominally constant capacitance value of a sense capacitance of a capacitive sense element of the MEMS device, or by facilitating maintenance of a nominally constant capacitance value of the sense capacitance—enabling stable operation of the MEMS device at points A, B, and C illustrated in FIG. 12. Further, such embodiments facilitate improvement of a signal-to-noise ratio (SNR) of the MEMS device by biasing the MEMS device beyond the pull-in voltage/point.

Figure 2:
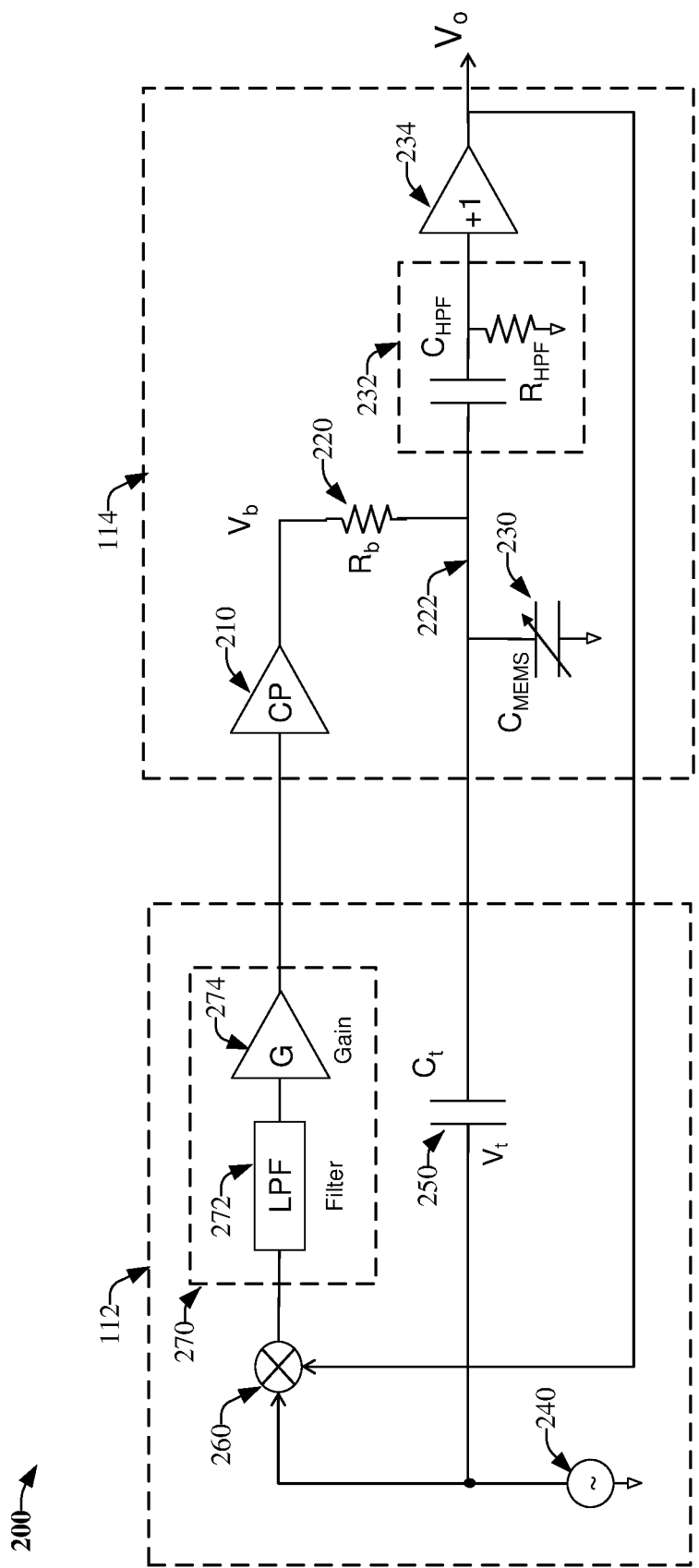
FIGS. 2-3 illustrates block diagrams of respective MEMS device circuits that apply respective nominally constant charges to capacitive sense elements of the respective MEMS device circuits, in accordance with various example embodiments.
Figure 3:
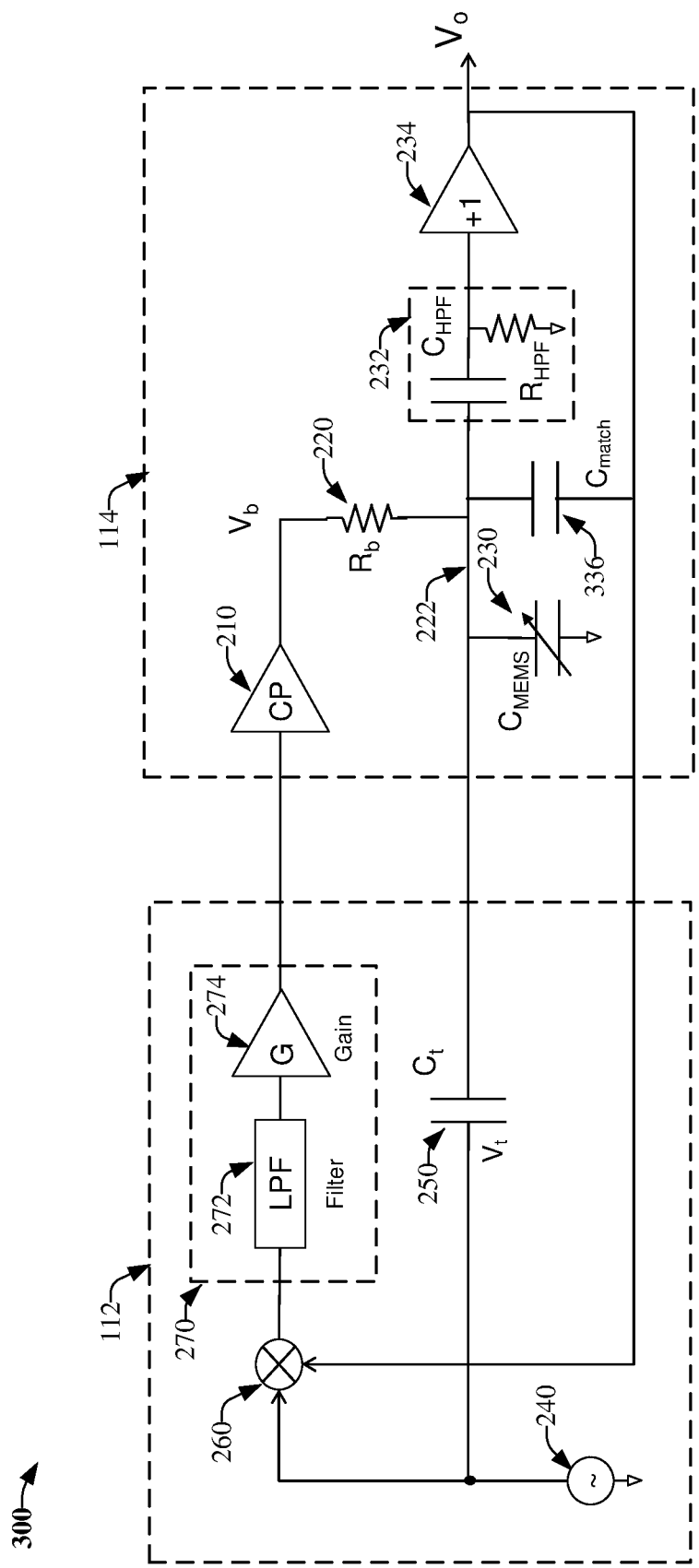

Referring now to FIGS. 2-3, block diagrams of respective MEMS device (110) circuits (200 and 300) that apply respective nominally constant charges to capacitive sense elements of the respective MEMS device circuits are illustrated, in accordance with various example embodiments.

The MEMS device (110), e.g., microphone, accelerometer, pressure sensor, ultrasonic receiver, gyroscope, or other type of vibration sensing device, comprises a capacitive sense element circuit (114) comprising a bias resistance ("$R_b$") (220) comprising a resistance input and a resistance output, a charge-pump ("CP") (210) comprising a charge pump input and a charge pump output, and a capacitive sense element (230) comprising an electrode (222) and a sense capacitance ("$C_{MEMS}$"), in which the charge-pump output generates a bias voltage ("$V_b$") at the resistance input, and the resistance output is electrically coupled to the electrode of the capacitive sense element.

In embodiment(s), the electrode is electrically coupled to the membrane of the capacitive sense element. In yet other embodiment(s), the electrode is electrically coupled to a backplate of the capacitive sense element.

In embodiments, the electrode is electrically coupled to a high-pass filter (HPF) (232) that comprises a HPF resistance ("$R_{HPF}$") and a HPF capacitance ("$C_{HPF}$"); and the HPF is electrically coupled to a unity gain buffer (234), which generates an output signal ("$V_o$") of the capacitive sense element circuit.

In embodiments, the output of the test capacitance and an input of a bootstrap capacitance (336) are electrically coupled between the HPF and the unity gain buffer.

In yet other embodiment(s), a first portion of the output signal of the capacitive sense element circuit represents an external force (e.g., audio signal) that has been applied to a membrane of the capacitive sense element, and a second portion of the output signal of the capacitive sense element circuit represents a measurement of the value of the sense capacitance.

In embodiment(s), the bias resistance ranges from about 1 giga-ohm to about 1 tera-ohm. In other embodiment(s), the bias voltage ranges from about 5 volts to about 20 volts.

The MEMS device further comprises a capacitance sensing circuit (112) comprising: a gain circuit (270); an AC signal source (240) that generates an AC signal (e.g., analog voltage; a digital waveform) at a defined frequency (e.g., being greater than a resonant frequency of the capacitive sense element; being in a range of about 50 kHz to about 1 MHz); a demodulator (260) that modulates a first demodulator input and a second demodulator input to obtain a demodulator output that is electrically coupled, via the gain circuit, to the charge pump input; and a test capacitance ("$C_t$") (250) comprising a test capacitance input and a test capacitance output.

The AC signal is electrically coupled to the first demodulator input and the test capacitance. The capacitance sensing circuit generates, based on the AC signal at the defined frequency, an AC test voltage ("$V_t$") at the test capacitance input; and the test capacitance output is electrically coupled to the electrode of the capacitive sense element.

In turn, the capacitive sense element circuit generates, based on the AC test voltage at the defined frequency, the output signal—the output signal representing a value of the sense capacitance as follows:

$$V_o = V_t * C_t / (C_{MEMS} + C_t).$$

In embodiment(s), the demodulator rectifies $V_o$, e.g., multiplies $V_o$ by a square wave at the same phase and frequency as $V_t$), resulting in a DC component of the demodulator output being equal to $$V_{demod} = \frac{2}{\pi} \frac{V_t C_t}{(C_{MEMS} + C_t)}.$$

In other embodiment(s), the gain circuit comprises a low-pass filter ("LPF") (272) electrically coupled to a gain stage (274) comprising a defined gain "G".

The demodulator, LPF, and gain stage provide a feedback signal to the charge-pump, in which the bias voltage is equal to $$V_b = \frac{2}{\pi} \frac{G V_t C_t}{(C_{MEMS} + C_t)},$$

so that the charge on test capacitance and the capacitive sense element of the MEMS device is ideally, or nominally, constant, being equal to $$q = V_b(C_{MEMS} + C_t) = \frac{2}{\pi} G V_t C_t.$$

Accordingly, the nominally constant charge ($q_{MEMS} + q_{Ct}$) is proportional to the defined gain G. In embodiment(s), if $C_t$ less than 10% of $C_{MEMS}$, the charge on $C_{MEMS}$ can be considered nominally constant.

In embodiment(s) illustrated by FIG. 3, the MEMS device further comprises a bootstrap capacitance ("$C_{match}$") (336) that is electrically coupled between the electrode of the capacitive sense element and the output signal of the capacitive sense element circuit. The bootstrap capacitance is used to bootstrap $C_t$, e.g., to prevent, account for, improve upon, etc. reduced sensitivity and/or increased distortion.

Figure 13:
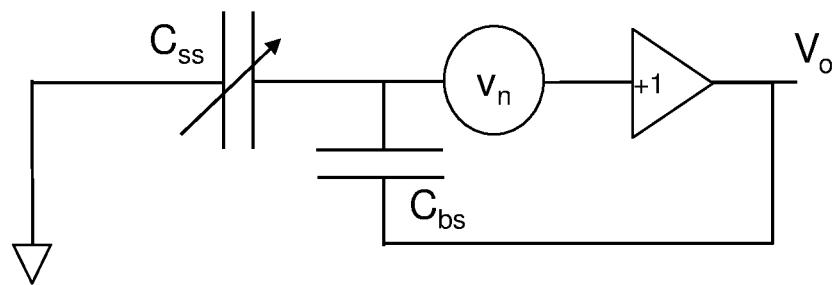
FIG. 13 illustrates a small-signal model of a MEMS device, in accordance with various example embodiments.

Referring now to FIG. 13, a block diagram (1300) of a small-signal model of a MEMS device, e.g., microphone, comprising a capacitive sense element is illustrated, in accordance with various example embodiments.

Css represents a small-signal capacitance of the MEMS device.

Cbs is a capacitance that is bootstrapped by a unity gain buffer ("+1").

$V_n$ is a voltage source representing noise of the unity gain buffer.

In turn, the component of the output signal ("$V_o$") due to noise is $$V_{on} = \left(1 + \frac{C_{bs}}{C_{ss}}\right) V_n,$$

in which larger values of Css represent lower values of output signal noise.

Referring again to FIG. 12, the slope of the line representing the plot of normalized charge versus normalized bias voltage is the small signal capacitance representing the change in charge versus small changes in voltage given by $$\left(\frac{dq}{dV} = C_{ss}\right).$$

In this regard, point A has a positive slope and positive value of $C_{ss}$.

Point B has a larger slope than point A; and as the value of $C_{ss}$ at point B is larger than the value of $C_{ss}$ at point A, point B will have lower noise than point A.

Point C has a negative slope and therefore has a negative value of $C_{ss}$.

If $C_{ss}$ is negative, e.g., at point C, the noise can be reduced, e.g., eliminated if $C_{ss}=-C_{bs}$.

In this regard, in embodiment(s), the bootstrap capacitance (336) facilitates reducing noise of the output signal of the capacitive sense element circuit in response to the capacitive sense element being biased in a negative capacitance region, e.g., to achieve $C_{ss}=-C_{bs}$.

Figure 4:
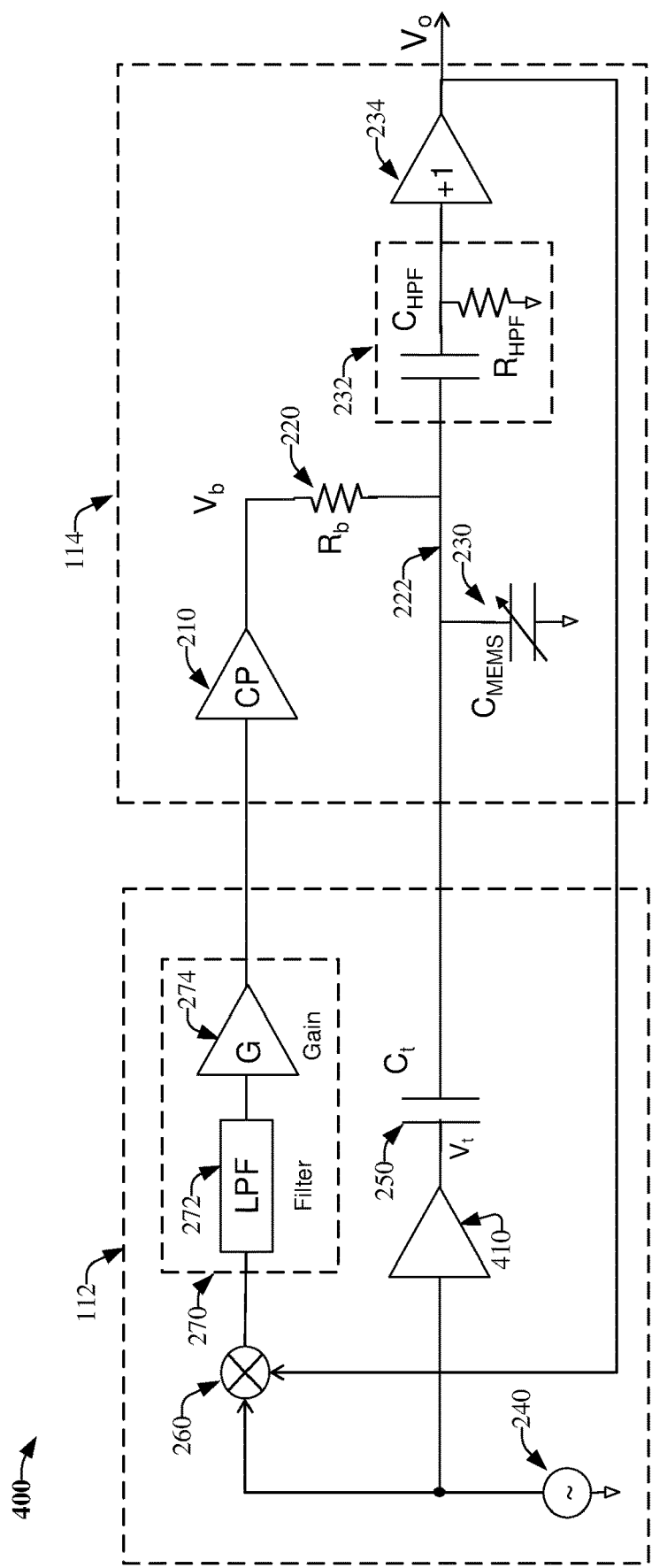
FIGS. 4-5 illustrates block diagrams of respective MEMS device circuits that include respective amplifiers electrically coupled to respective test capacitances—the respective MEMS devices applying respective nominally constant charges to capacitive sense elements of the respective MEMS device circuits, in accordance with various example embodiments.
Figure 5:
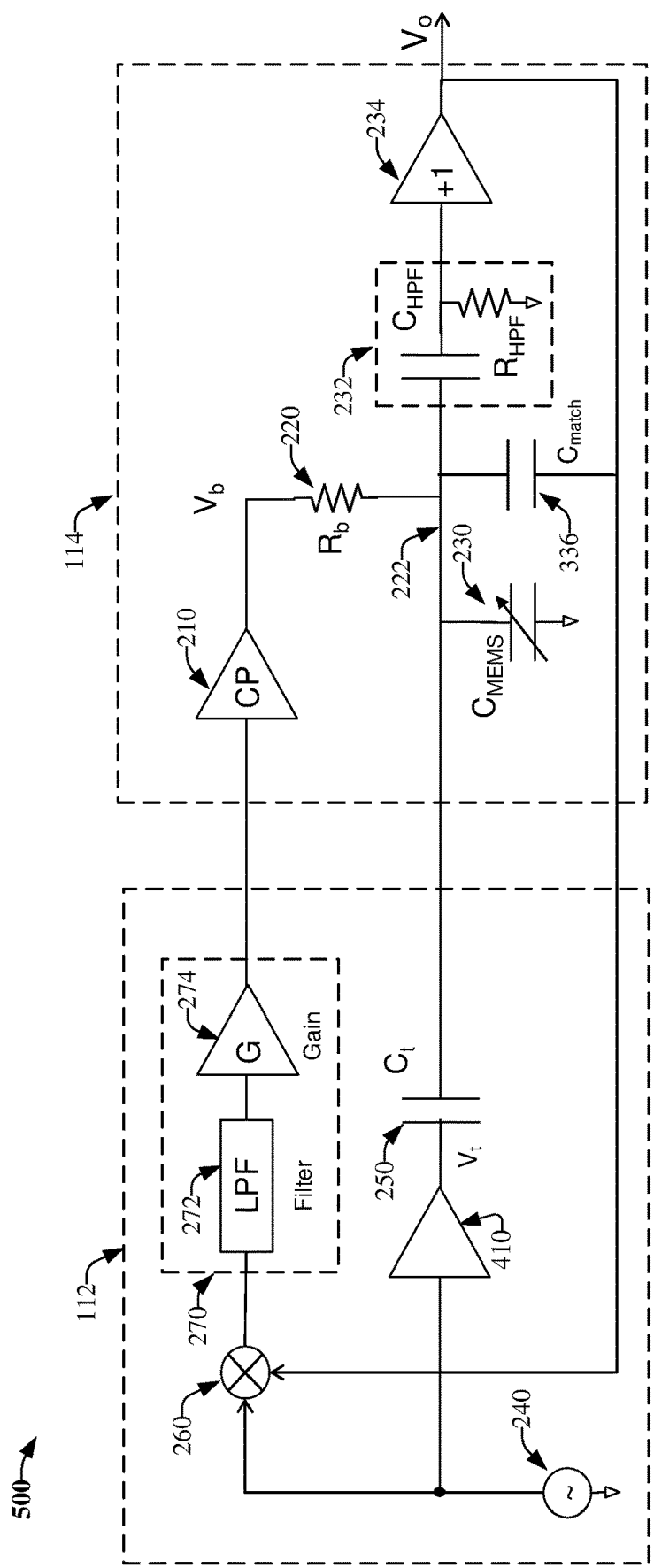

FIGS. 4-5 illustrate block diagrams of respective MEMS device circuits (400 and 500) that include respective amplifiers (410) electrically coupled to respective test capacitances (250)—the respective MEMS devices applying respective nominally constant charges to capacitive sense elements of the respective MEMS device circuits, in accordance with various example embodiments. In this regard, an amplifier (410) is electrically coupled between the AC signal source and the test capacitance (250), and the amplifier generates, based on the AC signal at the defined frequency, the test voltage ($V_t$).

Figure 6:
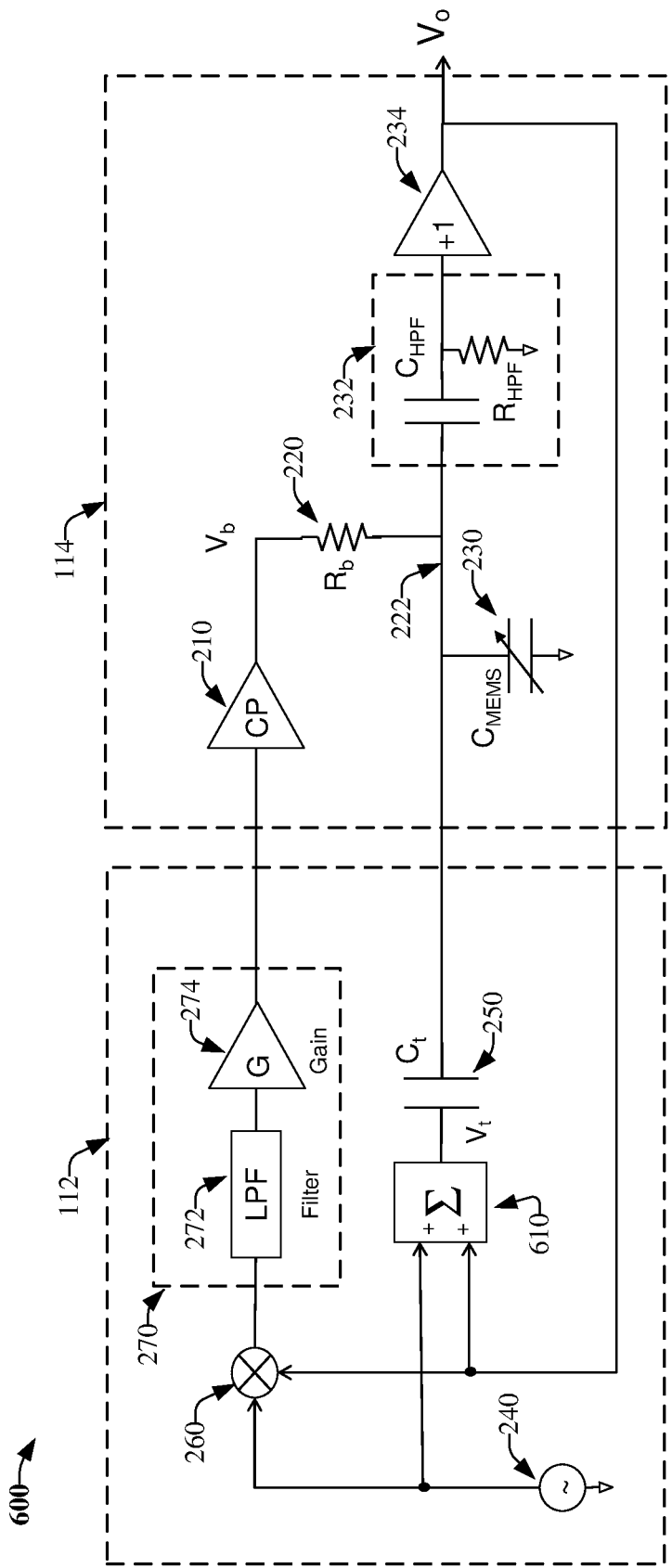
FIGS. 6-7 illustrates block diagrams of respective MEMS device circuits that include respective summing amplifiers electrically coupled to respective test capacitances—the respective MEMS devices applying respective nominally constant charges to capacitive sense elements of the respective MEMS device circuits, in accordance with various example embodiments.
Figure 7:
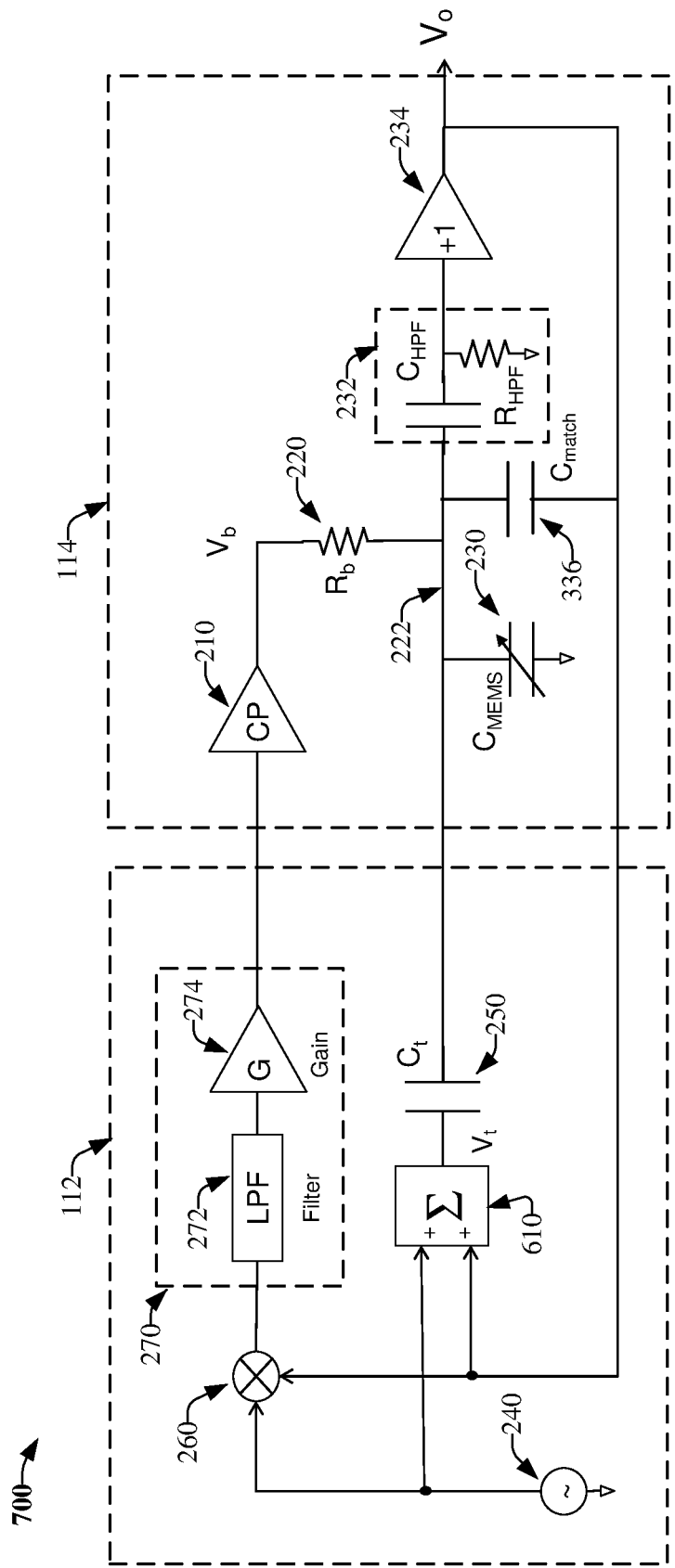

FIGS. 6-7 illustrates block diagrams of respective MEMS device circuits (600 and 700) that include respective summing amplifiers (610) electrically coupled to respective test capacitances (250)—the respective MEMS devices applying respective nominally constant charges to capacitive sense elements of the respective MEMS device circuits, in accordance with various example embodiments.

In turn, in embodiments with summing amplifier (610) the capacitive sense element circuit generates, based on the AC test voltage at the defined frequency, the output signal—the output signal representing a value of the sense capacitance as follows:

$$V_o = V_t * C_t / (C_{MEMS}).$$

In embodiment(s) with summing amplifier (610), the demodulator rectifies $V_o$, e.g., multiplies $V_o$ by a square wave at the same phase and frequency as $V_t$, resulting in a DC component of the demodulator output being equal to $$V_{demod} = \frac{2}{\pi} \frac{V_t C_t}{C_{MEMS}},$$

In embodiment(s) with the summing amplifier, the demodulator, LPF, and gain stage provide a feedback signal to the charge-pump, in which the bias voltage is equal to $$V_b = \frac{2}{\pi} \frac{G V_t C_t}{C_{MEMS}},$$

so that the charge on the capacitive sense element of the MEMS device is ideally, or nominally, constant, being equal to $$q_{MEMS} = V_b(C_{MEMS}) = \frac{2}{\pi} G V_t C_t.$$

Accordingly, the nominally constant charge ($q_{MEMS}$) is proportional to the defined gain G.

The summing amplifier (610) comprises a first amplifier input, a second amplifier input, and an amplifier output. The first amplifier input is electrically coupled to the AC signal, the second amplifier input is electrically coupled to the output signal of the capacitive sense element circuit, and the amplifier output is electrically coupled to the test capacitance input.

In this regard, the summing amplifier generates the test voltage based on the AC signal and the output signal of the capacitive sense element circuit—the output signal providing, via feedback to the summing amplifier, a positive loop gain <=1.

Figure 8:
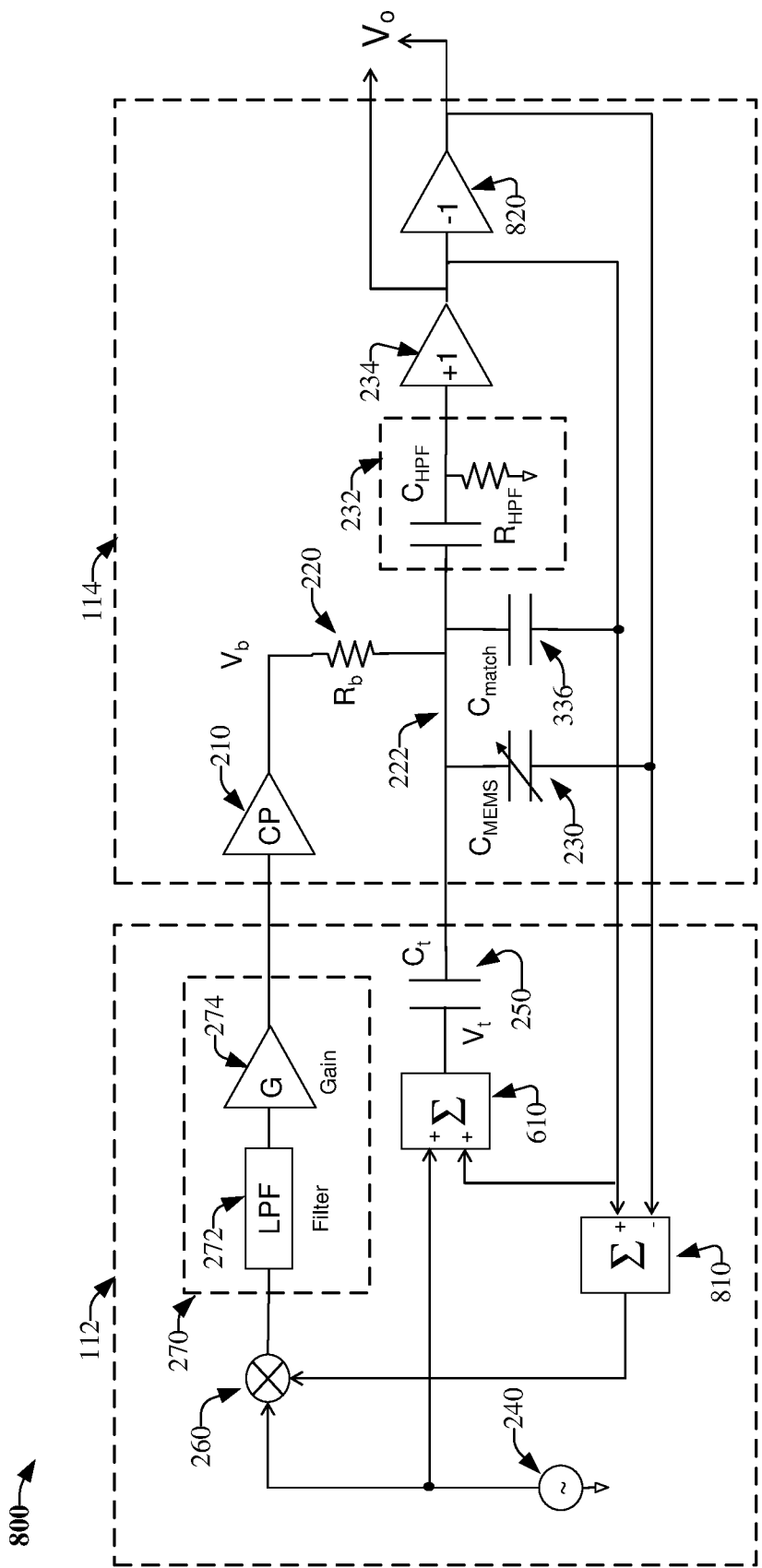
FIG. 8 illustrates a block diagram of a MEMS device circuit including a differential output—the MEMS device applying a nominally constant charge to a capacitive sense element of the MEMS device, in accordance with various example embodiments.

FIG. 8 illustrates a block diagram of a MEMS device circuit (800) including a differential output—the MEMS device applying a nominally constant charge to a capacitive sense element of the MEMS device, in accordance with various example embodiments. The capacitive sense element circuit comprises an inverting buffer (820) that generates an inverted output signal that is based on the output signal of the capacitance sense element circuit—a differential output signal, e.g., $V_o$, represented by the output signal and the inverted output signal.

The capacitance sensing circuit comprises a difference circuit (810) that comprises a first difference circuit input, a second difference circuit input, and a difference circuit output—the difference circuit facilitating subtraction of the first difference input and the second difference input. The first difference circuit input is electrically coupled to the output signal of the capacitive sense element circuit, the second difference circuit input is electrically coupled to the inverted output signal, the difference circuit output is electrically coupled to the second demodulator input of the demodulator.

Figure 9:
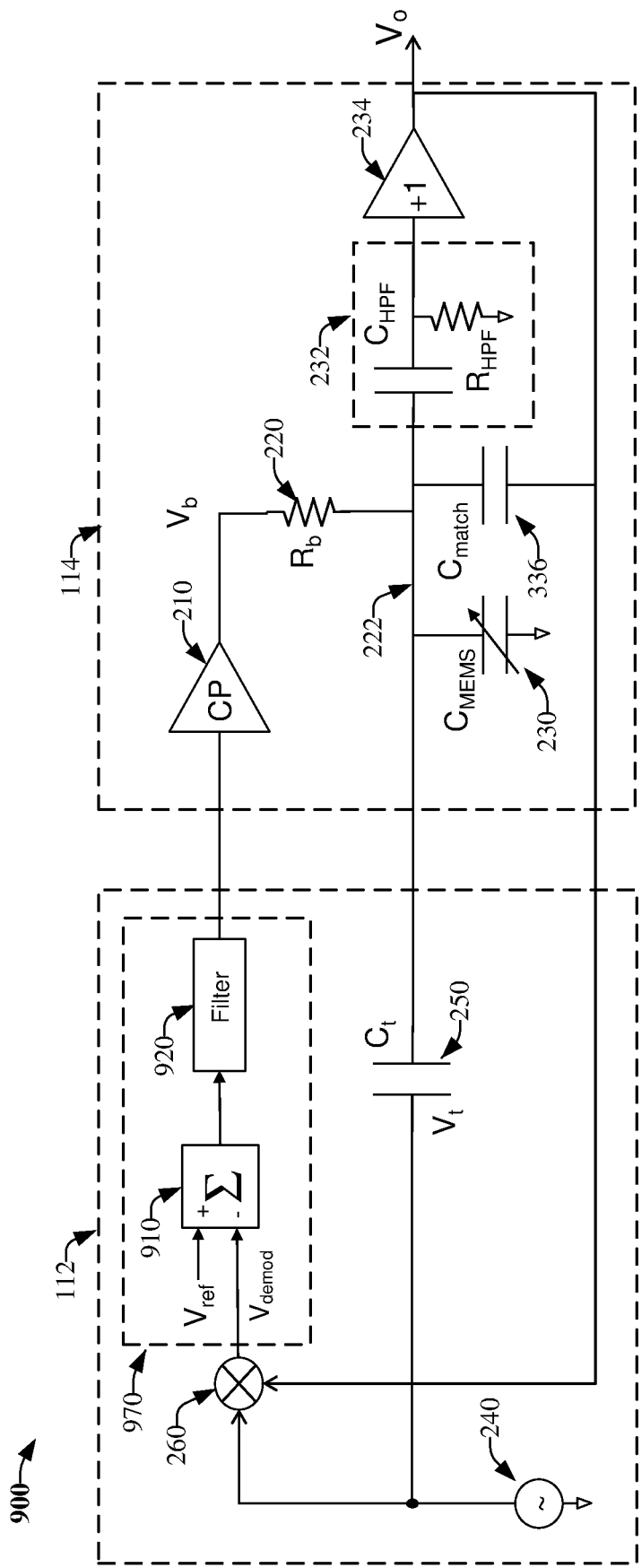
FIG. 9 illustrates a block diagram of a MEMS device circuit that facilitates maintenance of a nominally constant capacitance value of a sense capacitance of a capacitive sense element of the MEMS device, in accordance with various example embodiments.

FIG. 9 illustrates a block diagram of a MEMS device circuit (900) that facilitates maintenance of a nominally constant capacitance value of a sense capacitance of a capacitive sense element of the MEMS device, in accordance with various example embodiments. The MEMS device (110), e.g., microphone, accelerometer, pressure sensor, ultrasonic receiver, gyroscope, or other type of vibration sensing device, comprises a capacitive sense element circuit (114) comprising a bias resistance ("$R_b$") (220) comprising a resistance input and a resistance output, a charge-pump ("CP") (210) comprising a charge pump input and a charge pump output, and a capacitive sense element (230) comprising an electrode (222) and a sense capacitance ("$C_{MEMS}$"). The charge-pump output generates a bias voltage ("$V_b$") at the resistance input, and the resistance output is electrically coupled to the electrode of the capacitive sense element.

In other embodiment(s), the electrode is electrically coupled to the membrane of the capacitive sense element. In yet other embodiment(s), the electrode is electrically coupled to a backplate of the capacitive sense element.

In embodiments, the electrode is electrically coupled to a high-pass filter (HPF) (232) that comprises a HPF resistance ("$R_{HPF}$") and a HPF capacitance ("$C_{HPF}$"); and the HPF is electrically coupled to a unity gain buffer (234), which generates an output signal ("$V_o$") of the capacitive sense element circuit.

In embodiments, the test capacitance output and an input of the bootstrap capacitance are electrically coupled between the HPF and the unity gain buffer.

In yet other embodiment(s), a first portion of the output signal of the capacitive sense element circuit represents an external force (e.g., audio signal) that has been applied to a membrane of the capacitive sense element, and a second portion of the output signal of the capacitive sense element circuit represents a measurement of the value of the sense capacitance In embodiment(s), the bias resistance ranges from about 1 giga-ohm to about 1 tera-ohm. In other embodiment(s), the bias voltage ranges from about 5 volts to about 20 volts.

The MEMS device further comprises a capacitance sensing circuit (112) comprising: a gain circuit (970) comprising a difference circuit (910) and a filter (920); an AC signal source (240) that generates an AC signal (e.g., analog voltage; a digital waveform) at a defined frequency (e.g., being greater than a resonant frequency of the capacitive sense element; being in a range of about 50 kHz to about 1 MHz); a demodulator (260) that modulates a first demodulator input and a second demodulator input to obtain a demodulator output ("$V_{demod}$") that is electrically coupled, via the gain circuit, to the charge pump input; and a test capacitance ("$C_t$") (250) comprising a test capacitance input and a test capacitance output.

The AC signal is electrically coupled to the first demodulator input and the test capacitance. The capacitance sensing circuit generates, based on the AC signal at the defined frequency, an AC test voltage ("$V_t$") at the test capacitance input; and the test capacitance output is electrically coupled to the electrode of the capacitive sense element.

In turn, the capacitive sense element circuit generates, based on the AC test voltage at the defined frequency, the output signal—the output signal being electrically coupled to the second demodulator input and representing a value of the sense capacitance as follows:

$$V_o = V_t * C_t / (C_{MEMS} + C_t).$$

In embodiment(s), the demodulator rectifies $V_o$, e.g., multiplies $V_o$ by a square wave at the same phase and frequency as $V_t$), resulting in a DC component of the demodulator output being equal to $$V_{demod} = \frac{2}{\pi} \frac{V_t C_t}{(C_{MEMS} + C_t)}.$$

As illustrated by FIG. 9, the demodulator output is electrically coupled to a first input of the difference circuit, and a reference signal ("$V_{ref}$") is electrically coupled to a second input of the difference circuit. In turn, a difference output of the difference circuit is electrically coupled, via the filter, to the charge-pump input.

In turn, high DC gain of filter 920 in a feedback loop including filter 920 causes the demodulator output to match, via the difference circuit, the reference signal (e.g., $V_{demod} = V_{ref}$)—generating the nominally constant capacitance value of the sense capacitance equal to $$C_{MEMS} + C_t = \frac{2}{\pi} C_t \frac{V_t}{V_{ref}}.$$

Thus, in embodiment(s), a first magnitude of a sum of respective DC component values of the sense capacitance and the test capacitance is inversely proportional to a second magnitude of a second DC component of the reference signal.

In other embodiment(s), the defined frequency is greater than a resonant frequency of the capacitive sense element. In other embodiment(s), the defined frequency is in a range of about 50 kHz to about 1 MHz.

In yet other embodiment(s), a first portion of the output signal of the capacitive sense element circuit represents an external force that has been applied to a membrane of the capacitive sense element, and a second portion of the output signal of the capacitive sense element circuit represents a measurement of the value of the sense capacitance.

Figure 10:
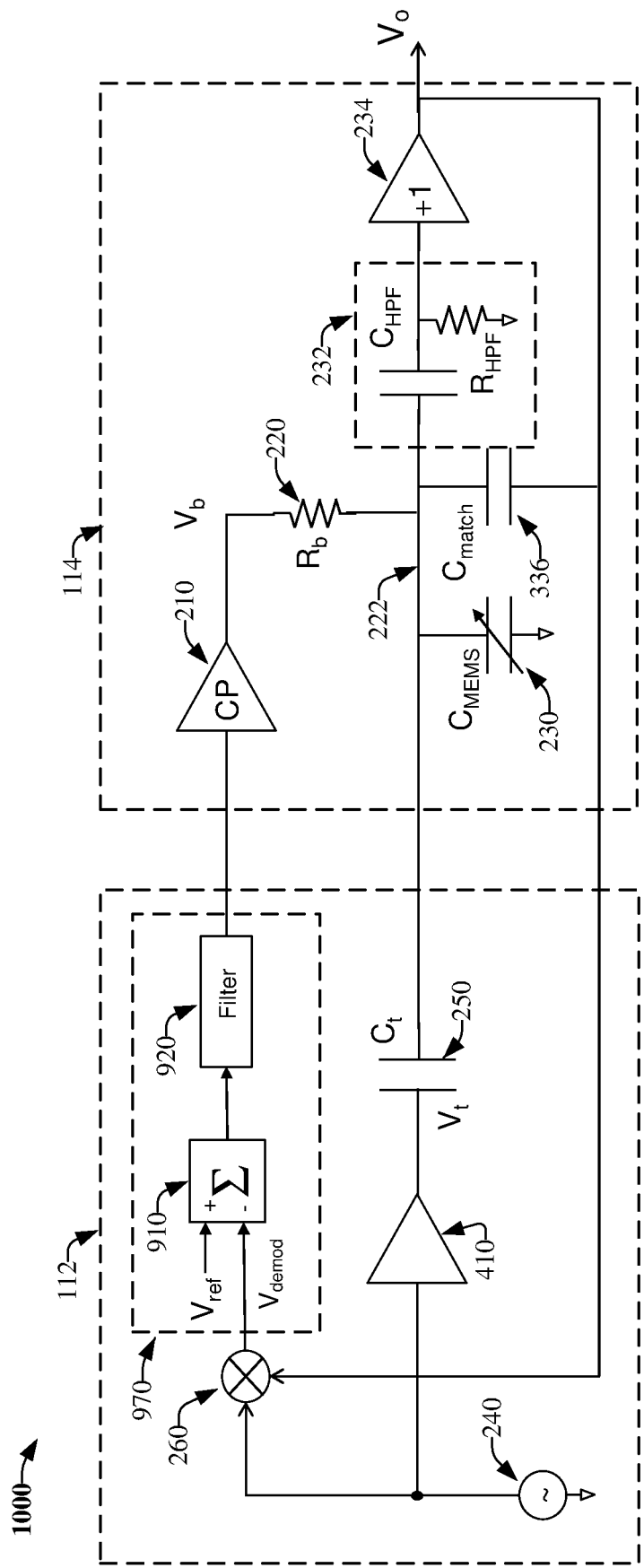
FIG. 10 illustrates a block diagram of a MEMS device circuit that includes an amplifier electrically coupled to a test capacitance—the MEMS device facilitating maintenance of a nominally constant capacitance value of a sense capacitance of a capacitive sense element of the MEMS device, in accordance with various example embodiments.

FIG. 10 illustrates a block diagram of a MEMS device circuit (1000) that includes an amplifier (410) electrically coupled to a test capacitance (250)—the MEMS device facilitating maintenance of a nominally constant capacitance value of a sense capacitance of a capacitive sense element (230) of the MEMS device, in accordance with various example embodiments. An amplifier (410) is electrically coupled between the AC signal source (240) and the test capacitance (250); and the amplifier generates, based on the AC signal source, the test voltage ($V_t$).

Figure 11:
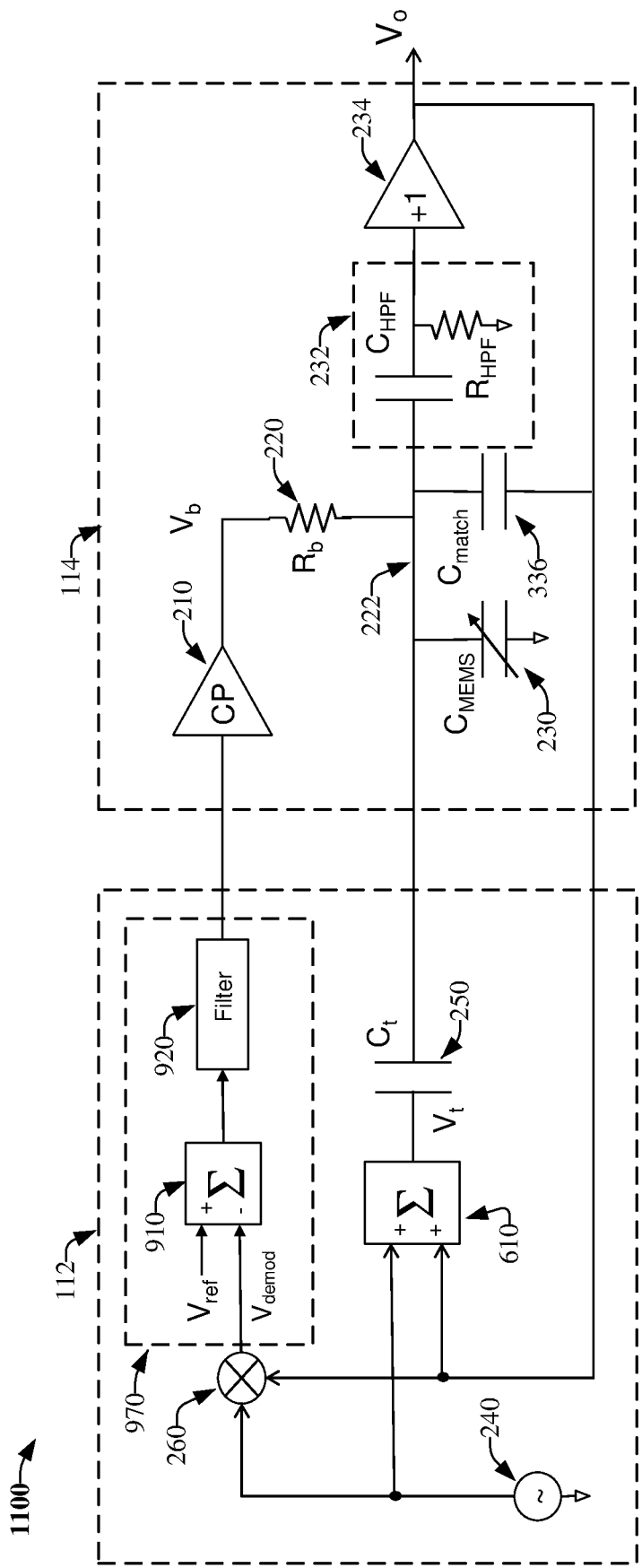
FIG. 11 illustrates a block diagram of a MEMS device circuit that includes a summing amplifier electrically coupled to a test capacitance—the MEMS device facilitating maintenance of a nominally constant capacitance value of a sense capacitance of a capacitive sense element of the MEMS device, in accordance with various example embodiments.

FIG. 11 illustrates a block diagram of a MEMS device circuit (1100) that includes a summing amplifier (610) that is electrically coupled to a test capacitance (250)—the MEMS device circuit facilitating maintenance of a nominally constant capacitance value of a sense capacitance of a capacitive sense element (230) of the MEMS device, in accordance with various example embodiments.

The summing amplifier (610) comprises a first amplifier input, a second amplifier input, and an amplifier output. The first amplifier input is electrically coupled to the AC signal, the second amplifier input is electrically coupled to the output signal of the capacitive sense element circuit, and the amplifier output is electrically coupled to the test capacitance input.

In this regard, the summing amplifier generates the test voltage based on the AC signal and the output signal of the capacitive sense element circuit—the output signal providing, via feedback to the summing amplifier, a positive loop gain $<=1$.

The, high DC gain of filter 920 in a feedback loop including filter 920 causes the demodulator output to match, via the difference circuit, the reference signal (e.g., $V_{demod}-V_{ref}$)—generating the nominally constant capacitance value of the sense capacitance equal to $$C_{MEMS} = \frac{2}{\pi} C_t \frac{V_t}{V_{ref}}.$$

Figure 14:
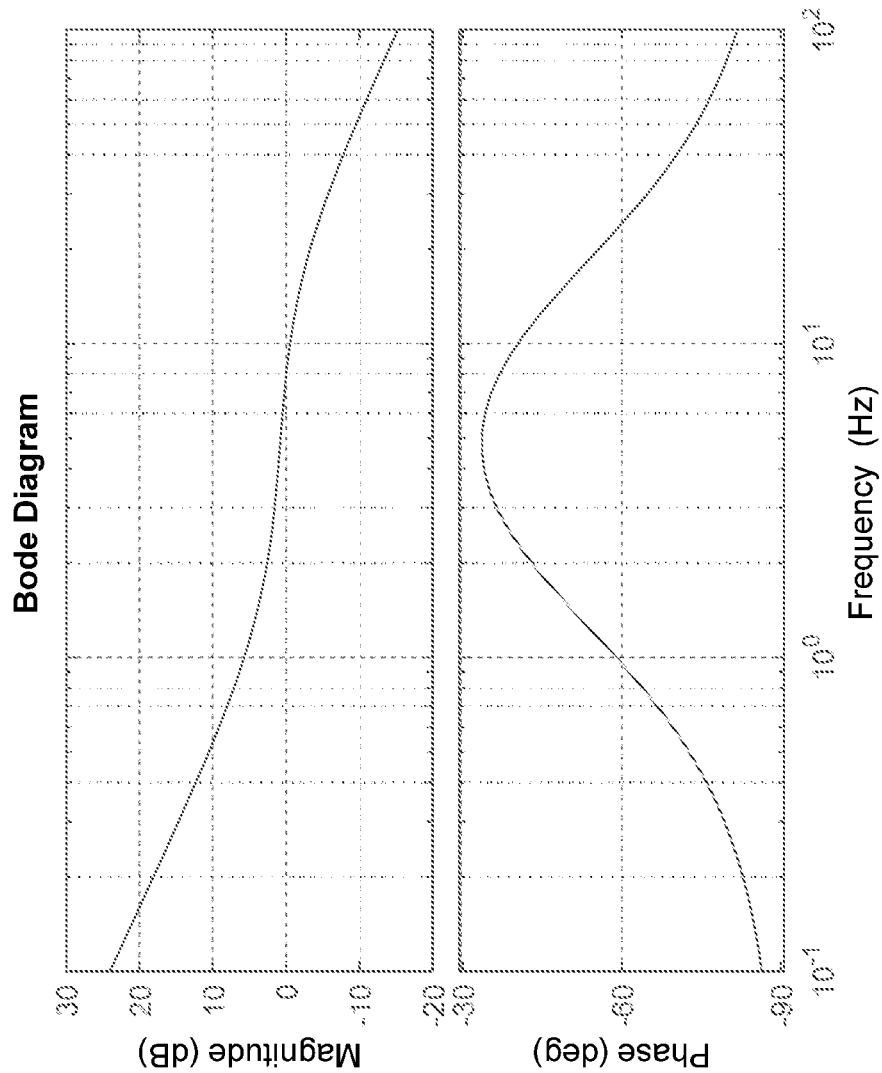
FIG. 14 illustrates a bode diagram of a constant capacitance filter of a MEMS device, in which the MEMS device facilitates maintenance of a nominally constant capacitance value of a sense capacitance of a capacitive sense element of the MEMS device, in accordance with various example embodiments.

FIG. 14 illustrates a bode diagram (1400) of a constant capacitance filter (920) of a MEMS device (110), in which the MEMS device facilitates maintenance of a nominally constant capacitance value of a sense capacitance of a capacitive sense element of the MEMS device, in accordance with various example embodiments. In embodiment(s), the constant capacitance filter includes an integrator (not shown) to provide high gain at DC summed with and LPF (not shown) to provide a defined phase margin with respect to maintaining closed-loop stability.

In other embodiment(s), a unity gain frequency of the integrator and a bandwidth of the LPF are typically low frequency, e.g., less than 100 Hz; below a low-frequency corner, e.g., −3 dB cutoff point, of a frequency response of the MEMS device.

In yet other embodiment(s), the low frequency corner, or other defined frequency points of the frequency response, are adjusted during startup or overload recovery of the MEMS device, e.g., to enable the MEMS device to settle to a steady state condition within a defined period of time.

In embodiment(s), portion(s) of the constant capacitance filter are digital filters corresponding to discrete-time signals associated with a continuous-time analog signals of the constant capacitance filter, e.g., to satisfy low-frequency time constants corresponding to implementation of the continuous-time analog signals.

Figure 15:
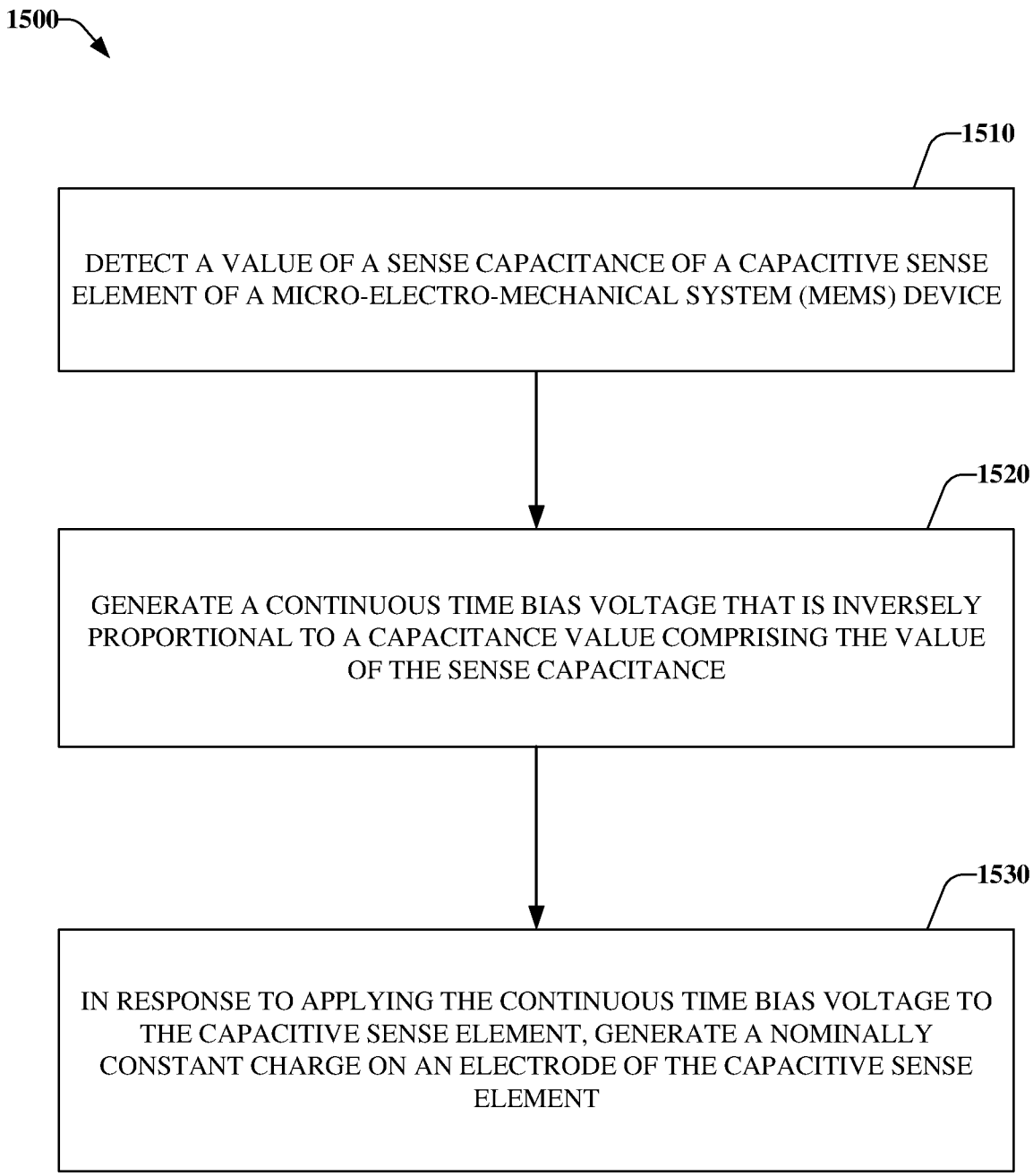
FIG. 15 illustrates a process performed by a MEMS device with respect to applying a nominally constant charge to a capacitive sense element of the MEMS device, in accordance with various example embodiments.

FIG. 15 illustrates a process/methodology in accordance with the disclosed subject matter. For simplicity of explanation, the process/methodology is depicted and described as a series of acts. It is to be understood and appreciated that various embodiments disclosed herein are not limited by the acts illustrated and/or by the order of acts. For example, acts can occur in various orders and/or concurrently, and with other acts not presented or described herein. Furthermore, not all illustrated acts may be required to implement the process/methodology in accordance with the disclosed subject matter. In addition, those skilled in the art will understand and appreciate that the process/methodology could alternatively be represented as a series of interrelated states via a state diagram or events.

Referring again to FIG. 15, a process (1500) performed by a MEMS device (110), e.g., microphone, accelerometer, pressure sensor, ultrasonic receiver, gyroscope, or other type of vibration sensing device, with respect to applying a nominally constant charge to a capacitive sense element of the MEMS device is illustrated, in accordance with various example embodiments. At 1510, a value of a sense capacitance of a capacitive sense element of the MEMS device is detected. At 1520, a continuous time bias voltage that is inversely proportional to a capacitance value comprising the value of the sense capacitance is generated. At 1530, a nominally constant charge on the capacitive sense element is generated in response to the continuous time bias voltage being applied to the capacitive sense element.

In embodiment(s), the value of the sense capacitance is detected by applying an AC test voltage at a defined frequency to a test capacitance input of a test capacitance, in which a test capacitance output of the test capacitance is electrically coupled to the capacitive sense element, and an output signal of the MEMS device represents, based on the AC test voltage at the defined frequency, the value of the sense capacitance.

In other embodiment(s), the applying of the AC test voltage to the test capacitance input further comprises applying the AC test voltage to the test capacitance input in a frequency range of about 50 kHz to about 1 MHz.

In yet other embodiment(s), the method further comprises reducing, via a bootstrap capacitance that is electrically coupled to an output signal of the MEMS device, a noise of the output signal of the MEMS device in response to biasing the capacitance of the capacitive sense element in a negative capacitance region.

Aspects of circuits, devices, processes, and process blocks explained herein can be embodied within hardware, such as an ASIC, digital logic, or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

As it is employed in the subject specification, the terms "circuit" and "device" refer to substantially any analog and/or digital based device(s), circuit(s), etc. comprising, e.g., a micro-electro-mechanical structure, a resistor, a capacitor, a transistor, a diode, an inductor, a memory, a programmable device, e.g., fuse, field programmable gate array (FPGA), complex programmable logic device (CPLD), etc. relevant to performing operations and/or functions of circuit(s), device(s), system(s), etc. disclosed herein.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

To the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The above description of illustrated embodiments of the subject disclosure is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A micro-electro-mechanical system (MEMS) device, comprising:
   a capacitance sensing circuit comprising
      a capacitive sensing circuit input and a pair of capacitive sensing circuit outputs,
      a test capacitance comprising a test capacitance input and a test capacitance output,
      a demodulator comprising a pair of demodulator inputs and a demodulator output,
      a gain circuit comprising low-pass filter and a stage,
      an alternating current (AC) signal source that generates an AC signal at a defined frequency, wherein the demodulator modulates the pair of demodulator inputs to obtain the demodulator output, wherein the AC signal is electrically coupled to a first demodulator input of the pair of demodulator inputs and the test capacitance input, wherein thane sensing circuit comprises a second demodulator input of the pair of demodulator inputs, wherein the demodulator output is electrically coupled to a low-pass filter input of the low-pass filter, wherein a low-pass filter output of the low-pass filter is electrically coupled to a gain stage input of the gain stage, wherein a first capacitive sensing circuit output of the pair of capacitive sensing circuit outputs comprises a gain stage output of the gain stage, and wherein a second capacitive sensing circuit output of the pair of capacitive sensing circuit outputs comprises the test capacitance output; and
   a capacitive sense element circuit comprising
      a pair of capacitive sense element circuit inputs and a capacitive sense element circuit output,
      a charge-pump comprising a charge pump input and a charge pump output,
      a bias resistance comprising a bias resistance input and a bias resistance output,
      a capacitive sense element comprising an electrode and a sense capacitance,
      a high-pass filter comprising a high-pass filter input and a high-pass filter output, and
      a unity gain buffer comprising a unity gain buffer input and a unity gain buffer output, wherein the a first capacitive sense element circuit input of the pair of capacitive sense element circuit inputs comprises the charge pump input, wherein the test capacitance output is electrically coupled to a second capacitive sense element circuit input of the pair of capacitive sense element circuit inputs, wherein the second capacitive sense element circuit input is electrically coupled to the electrode of the capacitive sense element, wherein the charge pump output generates a bias voltage at the resistance input, wherein the resistance output is electrically coupled to the electrode of the capacitive sense element, wherein the electrode of the capacitive sense element is electrically coupled to the high-pass filter input, wherein the high-pass filter output is electrically coupled to the unity-gain buffer input, wherein the capacitive sense element circuit output comprises the unity gain buffer output, wherein the capacitance sensing circuit generates, based on the AC signal at the defined frequency, an AC test voltage at the test capacitance input, wherein the capacitive sense element circuit generates, based on the AC test voltage at the defined frequency, the capacitive sense element circuit output, wherein the capacitive sense element circuit output is electrically coupled, via the capacitive sensing circuit input, to the second demodulator input and represents a value of the sense capacitance, and wherein the bias voltage is proportional to an inverse of a capacitance value comprising the value of the sense capacitance to facilitate maintenance of a nominally constant charge on the electrode of the capacitive sense element.

2. The MEMS device of claim 1, wherein the defined frequency is greater than a resonant frequency of the capacitive sense element.

3. The MEMS device of claim 1, wherein the defined frequency is in a range of about 50 kHz to about 1 MHz.

4. The MEMS device of claim 1, wherein a first portion of the capacitive sense element circuit output represents an external force that has been applied to a membrane of the capacitive sense element, and wherein a second portion of the capacitive sense element circuit output represents a measurement of the value of the sense capacitance.

5. The MEMS device of claim 4, further comprising:
   an amplifier that is electrically coupled between the AC signal source and the test capacitance, and that generates, based on the AC signal, the AC test voltage at the test capacitance input.

6. The MEMS device of claim 5, wherein the amplifier comprises:
   a summing amplifier comprising a first amplifier input, a second amplifier input, and an amplifier output, wherein the first amplifier input is electrically coupled to the AC signal, wherein the second amplifier input is electrically coupled to the capacitive sense element circuit output, and wherein the amplifier output is electrically coupled to the test capacitance input.

7. The MEMS device of claim 6, wherein an amplitude of the second portion of the capacitive sense element circuit output is inversely proportional to the value of the sense capacitance.

8. The MEMS device of claim 7, wherein the capacitive sense element circuit further comprises an inverting buffer that generates an inverted output signal that is based on the capacitive sense element circuit output, wherein a differential output signal of the capacitive sense element circuit is represented by the capacitive sense element circuit output and the inverted output signal, wherein the capacitance sensing circuit further comprises a difference circuit that comprises a first difference circuit input, a second difference circuit input, and a difference circuit output, wherein the first difference circuit input is electrically coupled to the capacitive sense element circuit output, wherein the second difference circuit input is electrically coupled to the inverted output signal, and wherein the difference circuit output is electrically coupled to the second demodulator input of the demodulator.

9. The MEMS device of claim 1, wherein the gain stage comprises a defined gain, and wherein the nominally constant charge is proportional to the defined gain.

10. The MEMS device of claim 1, further comprising:
a bootstrap capacitance that is electrically coupled between the electrode of the capacitive sense element and the capacitive sense element circuit output.

11. The MEMS device of claim 10, wherein the bootstrap capacitance facilitates reducing noise of the capacitive sense element circuit output in response to the capacitive sense element being biased in a negative capacitance region.

12. A micro-electro-mechanical system (MEMS) device, comprising:
a capacitance sensing circuit comprising
a capacitive sensing circuit input and a pair of capacitive sensing circuit outputs,
a test capacitance comprising a test capacitance input and a test capacitance output,
a demodulator comprising a pair of demodulator inputs and a demodulator output,
a gain circuit comprising a difference circuit and a filter, and
an alternating current (AC) signal source that generates an AC signal at a defined frequency, wherein the demodulator modulates the pair of demodulator inputs to obtain the demodulator output, wherein the AC signal is electrically coupled to a first demodulator input of the pair of demodulator inputs and the test capacitance input, wherein the capacitive sensing circuit input comprises a second demodulator input of the pair of demodulator inputs, wherein the demodulator output is electrically coupled to a first difference circuit input of the difference circuit, wherein a reference signal is electrically coupled to a second difference circuit input of the difference circuit, wherein a difference circuit output of the difference circuit is electrically coupled to a filter input of the filter, wherein a first capacitive sensing circuit output of the pair of capacitive sensing circuit outputs comprises a filter output of the filter, and wherein a second capacitive sensing circuit output of the pair of capacitive sensing circuit outputs comprises the test capacitance output; and
a capacitive sense element circuit comprising
a pair of capacitive sense element circuit inputs and a capacitive sense element circuit output,
a charge-pump comprising a charge pump input and a charge pump output,
a bias resistance comprising a bias resistance input and a bias resistance output,
a capacitive sense element comprising an electrode and a sense capacitance,
a high-pass filter comprising a high-pass filter input and a high-pass filter output, and
a unity gain buffer comprising a unity gain buffer input and a unity gain buffer output, wherein a first capacitive sense element circuit input of the pair of capacitive sense element circuit inputs comprises the charge pump input, wherein the test capacitance output is electrically coupled to a second capacitive sense element circuit input of the pair of capacitive sense element circuit inputs, wherein the second capacitive sense element circuit input is electrically coupled to the electrode of the capacitive sense element, wherein the charge pump output generates a bias voltage at the resistance input, wherein the resistance output is electrically coupled to the electrode of the capacitive sense element, wherein the electrode of the capacitive sense element is electrically coupled to the high-pass filter input, wherein the high-pass filter output is electrically coupled to the unity-gain buffer input, wherein the capacitive sense element circuit output comprises the unity gain buffer output, wherein the capacitance sensing circuit generates, based on the AC signal at the defined frequency, an AC test voltage at the test capacitance input, wherein the capacitive sense element circuit generates, based on the AC test voltage at the defined frequency, the capacitive sense element circuit output, wherein the capacitive sense element circuit output is electrically coupled, via the capacitive sensing circuit input, to the second demodulator input and represents a value of the sense capacitance and wherein the demodulator output nominally equals the reference signal to facilitate maintenance of a nominally constant value of the sense capacitance.

13. The MEMS device of claim 12, wherein the defined frequency is greater than a resonant frequency of the capacitive sense element.

14. The MEMS device of claim 12, wherein the defined frequency is in a range of about 50 kHz to about 1 MHz.

15. The MEMS device of claim 12, wherein a first portion of the capacitive sense element circuit output represents an external force that has been applied to a membrane of the capacitive sense element, and wherein a second portion of the capacitive sense element circuit output represents a measurement of the value of the sense capacitance.

16. The MEMS device of claim 12, wherein a first magnitude of a sum of respective DC component values of the sense capacitance and the test capacitance is inversely proportional to a second magnitude of a second DC component of the reference signal.

17. The MEMS device of claim 12, further comprising:
an amplifier that is electrically coupled between the AC signal source and the test capacitance, and that generates, based on the AC signal, the AC test voltage at the test capacitance input.

18. The MEMS device of claim 17, wherein the amplifier comprises:
a summing amplifier comprising a first amplifier input, a second amplifier input, and an amplifier output, wherein the first amplifier input is electrically coupled to the AC signal, wherein the second amplifier input is electrically coupled to the capacitive sense element circuit output, and wherein the amplifier output is electrically coupled to the test capacitance input.

19. The MEMS device of claim 18, wherein an amplitude of the second portion of the capacitive sense element circuit output is inversely proportional to the value of the sense capacitance.

20. The MEMS device of claim 12, further comprising:
a bootstrap capacitance that is electrically coupled between the electrode of the capacitive sense element and the capacitive sense element circuit output.

21. The MEMS device of claim 20, wherein the bootstrap capacitance facilitates reducing noise of the capacitive sense element circuit output in response to the capacitive sense element being biased in a negative capacitance region.

22. A method, comprising:
   detecting a value of a sense capacitance of a capacitive sense element of a capacitive sense element circuit of a micro-electro-mechanical system (MEMS) device by applying an alternating current (AC) test voltage at a defined frequency to a test capacitance input of a test capacitance, wherein a test capacitance output of the test capacitance is electrically coupled to a capacitive sense element circuit input of the capacitive sense element circuit, wherein the capacitive sense element circuit input is electrically coupled to an electrode of the capacitive sense element, wherein the electrode of the capacitive sense element is electrically coupled to a high-pass filter input of a high-pass filter of the capacitive sense element circuit, wherein a high-pass filter output of the high-pass filter is electrically coupled to a unity-gain buffer input of a unity-gain buffer of the capacitive sense element circuit, wherein a capacitive sense element circuit output of the capacitive sense element circuit comprises a unity gain buffer output of the unity-gain buffer, wherein the capacitive sense element circuit generates, based on the AC signal at the defined frequency, the capacitive sense element circuit output, and wherein the capacitive sense element circuit output represents the value of the sense capacitance;
   generating a continuous time bias voltage that is inversely proportional to a capacitance value comprising the value of the sense capacitance; and
   in response to applying the continuous time bias voltage to the capacitive sense element, generating a nominally constant charge on an electrode of the capacitive sense element.

23. The method of claim 22, wherein the applying of the AC test voltage to the test capacitance input further comprises:
   applying the AC test voltage to the test capacitance input in a frequency range of about 50 kHz to about 1 MHz.

24. The method of claim 22, further comprising:
   in response to biasing the capacitance of the capacitive sense element in a negative capacitance region, reducing, via a bootstrap capacitance that is electrically coupled to an output signal of the MEMS device, a noise of the output signal of the MEMS device.

* * * * *